United States Patent
Schulz-Harder et al.

(10) Patent No.: US 7,750,461 B2
(45) Date of Patent: Jul. 6, 2010

(54) METAL-CERAMIC SUBSTRATE FOR ELECTRIC CIRCUITS OR MODULES, METHOD FOR PRODUCING ONE SUCH SUBSTRATE AND MODULE COMPRISING ONE SUCH SUBSTRATE

(75) Inventors: Jürgen Schulz-Harder, Lauf (DE); Peter Haberl, Hirschau (DE)

(73) Assignee: Curamix Electronics GmbH, Eschenback (DE)

( * ) Notice: Subject to any disclaimer, the term of this patent is extended or adjusted under 35 U.S.C. 154(b) by 0 days.

(21) Appl. No.: 10/515,633

(22) PCT Filed: Apr. 11, 2003

(86) PCT No.: PCT/DE03/01242

§ 371 (c)(1),
(2), (4) Date: Dec. 6, 2004

(87) PCT Pub. No.: WO04/002204

PCT Pub. Date: Dec. 31, 2003

(65) Prior Publication Data
US 2006/0103005 A1    May 18, 2006

(30) Foreign Application Priority Data
Jun. 20, 2002 (DE) .................. 102 27 658

(51) Int. Cl.
*H01L 23/12* (2006.01)
*H01L 23/053* (2006.01)

(52) U.S. Cl. .............. 257/700; 257/703; 257/705; 257/724; 257/758; 257/177; 257/E23.009; 257/E23.106

(58) Field of Classification Search ......... 257/700–703, 257/705, 723, 724, 758, 759, 760, 177, 178, 257/181, E23.009, E23.038, E23.106; 361/746
See application file for complete search history.

(56) References Cited

U.S. PATENT DOCUMENTS

| | | | |
|---|---|---|---|
| 4,642,148 A | | 2/1987 | Kurihara et al. |
| 4,862,323 A | * | 8/1989 | Butt ........................... 361/708 |
| 4,946,709 A | * | 8/1990 | Takada et al. ............... 427/97.2 |
| 6,207,221 B1 | | 3/2001 | Schulz-Harder |
| 2002/0027018 A1 | * | 3/2002 | Chikagawa et al. ......... 174/255 |
| 2002/0060091 A1 | * | 5/2002 | Naba et al. .................. 174/257 |
| 2002/0104877 A1 | * | 8/2002 | Morimoto et al. ........... 228/224 |
| 2003/0070839 A1 | * | 4/2003 | Boyko et al. ................ 174/262 |

FOREIGN PATENT DOCUMENTS

GB    2140628    11/1984
JP    2001294489 A  *  10/2001

* cited by examiner

*Primary Examiner*—Sue Purvis
*Assistant Examiner*—Leslie Pilar Cruz
(74) *Attorney, Agent, or Firm*—Hoffman Wasson & Gitler

(57) ABSTRACT

The invention relates to a metal-ceramic substrate for electric circuits or modules, said substrate including a ceramic layer which is provided with at least one metallic layer of a first type applied to a surface of said ceramic layer in a plane manner. An insulating layer made up of a glass-containing material is applied to at least one partial region of a surface of the metallic layer of the first type, said surface opposing the ceramic layer, and a metallic layer of a second type is applied to the insulating layer, the insulating layer and the metallic layer of a second type respectively being thinner then the ceramic layer and the metallic layer of the first type.

32 Claims, 8 Drawing Sheets

METAL-CERAMIC SUBSTRATE FOR ELECTRIC CIRCUITS OR MODULES, METHOD FOR PRODUCING ONE SUCH SUBSTRATE AND MODULE COMPRISING ONE SUCH SUBSTRATE

BACKGROUND OF THE INVENTION

The invention relates to a metal-ceramic substrate to a method for producing one such metal-ceramic substrate and a module, particularly a semiconductor power module with a metal-ceramic substrate.

Metal-ceramic substrates, also copper-ceramic substrates for electric circuits, particularly for semiconductor power circuits or modules, are known in a wide variety of designs. Also known in particular for the manufacture of strip conductors, connectors, etc. is the application of a metallization on a ceramic, e.g. on an aluminum-oxide ceramic by means of the so-called "DCB process" (direct copper bond technology), said metallization being formed from metal or copper foils or metal or copper sheets, the surfaces of which include a layer or a coat (hot-melt layer) from a chemical bond between the metal and a reactive gas, preferably oxygen. In this method, which is described, for example, in US PS 37 44 120 and in PS 23 19 854, this layer or coat (hot-melt layer) forms a eutectic with a melting temperature below the melting temperature of the metal (e.g. copper), so that the layers can be bonded to each other by placing the foil on the ceramic and heating all layers, namely by melting the metal or copper essentially only in the area of the hot-melt layer or oxide layer.

This DCB process then includes, for example, the following process steps:
- a) oxidation of a copper foil so as to produce an even copper oxide layer;
- b) placing the copper foil on the ceramic layer;
- c) heating the composite to a process temperature between approx. 1025 and 1083° C., e.g. to approx. 1071° C.;
- d) cooling to room temperature.

Electric circuits or modules, particularly power circuits or modules with a power element and a control or drive element have heretofore been manufactured in the manner that a metal-ceramic substrate is used as a substrate or circuit board for the power element and that the control or drive circuit on a separate circuit board assembled with its components is then mounted by suitable means in a second level above the power element or next to the latter on the metal-ceramic substrate.

The disadvantage of this method, for example, is the high cost of manufacture, since the power element and the control or drive stage must be manufactured separately and then connected and bonded together in production. In particular, this known technology does not allow the multiple manufacture of the entire module (power element+control and driver stage) in accordance with the principles of efficient production.

It is an object of the invention to present a metal-ceramic substrate which enables the particularly efficient production of circuits, particularly semiconductor circuits and especially power circuits with a corresponding control and driver stage.

SUMMARY OF THE INVENTION

Some advantages of the invention can be summarized as follows:
- e) simplified production of both the power area and the control and driver area;
- f) exact positioning of the power area and of the control or drive area and the areas formed there by means of structuring (strip conductors, contact surfaces, mounting surfaces, etc.) and therefore also simplification of the mounting of the components;
- g) mounting of elements in the power area and of the control and driver area is possible in one step;
- h) since no organic substrate material is used, high soldering temperatures, for example soldering temperatures up to 400° C. for mounting of the components are possible, and in particular, lead-free solder can be used;
- i) application of a solder or adhesive paste during surface mounting of the substrate is simplified considerably, since the level of the surface of the power element to be mounted and the level of the surface of the control or driver element to be mounted differ only minimally;
- j) the application of solder paste or adhesives for surface mounting of both the power element and the control or drive element is possible in one step;
- k) simplified wiring between the power element and the control and driver element through ultrasonic bonding;
- l) improved cooling of the control or drive stage due to improved bonding to a cooling system;
- m) highly complex lay out of the control and driver stage is possible due to cross-over technology, which can easily be implemented.

BRIEF DESCRIPTION OF THE DRAWINGS

Exemplary embodiments of the invention are explained below in more detail with reference to the drawings, wherein.

DETAILED DESCRIPTION OF THE DRAWINGS

Figure 1:
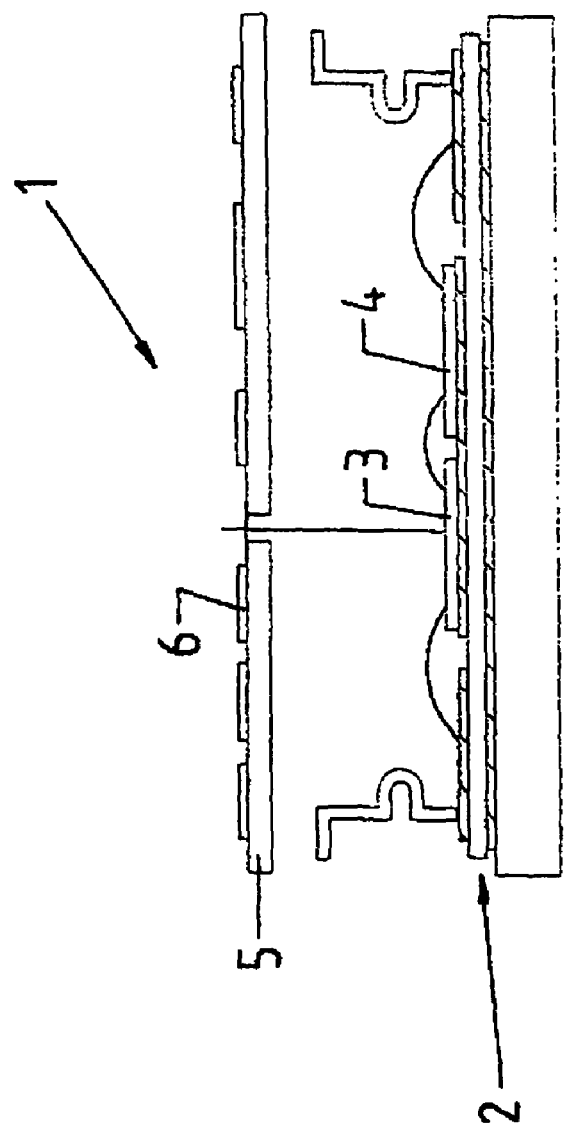
FIGS. 1 and 2 show a simplified cross section of semiconductor modules according to the state of the art.
Figure 2:
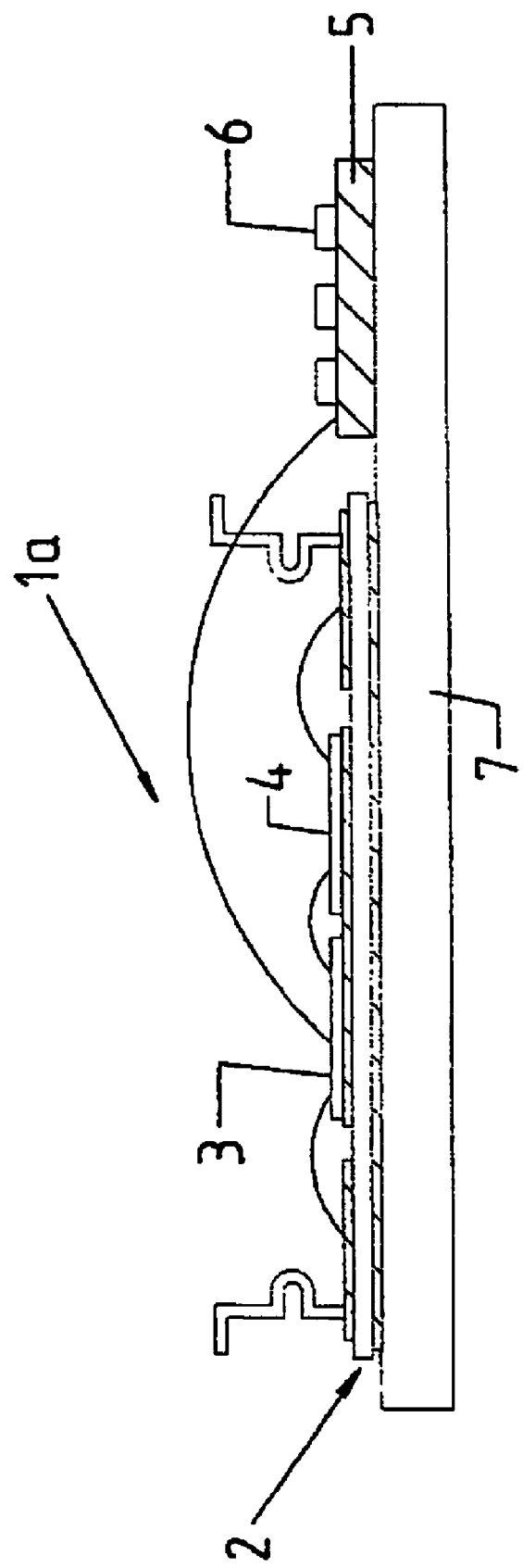

FIG. 1 shows a simplified representation in cross section of a semiconductor module 1, as known from the state of the art. This semiconductor module consists of a copper-ceramic substrate 2 with semiconductor power components 3 and 4, for example transistors or thyristors for controlling an electric drive, etc., and of a printed circuit board 5 made of organic material (plastic), which is equipped with components 6 and forms a driver or control stage to control the power components 3 and 4. The printed circuit board 5 with the components 6 is located above the substrate 2. FIG. 2 shows a semiconductor module 1a, also as known from the prior art. The substrate 2 with the power components 3 and 4 is provided on a common base plate 7, together with the printed circuit board 5 made of organic material (plastic) and comprising the components 6 and located to the side of the substrate 2 on a carrier 7.

The known construction has the disadvantage of complex wiring and ensuing higher assembly costs. In addition, it is necessary for both parts of the module 1 or 1a, namely the substrate 2 and the part comprising the printed circuit board 5 with the components 6 to be manufactured separately, and then connected and mechanically bonded.

Figure 3:
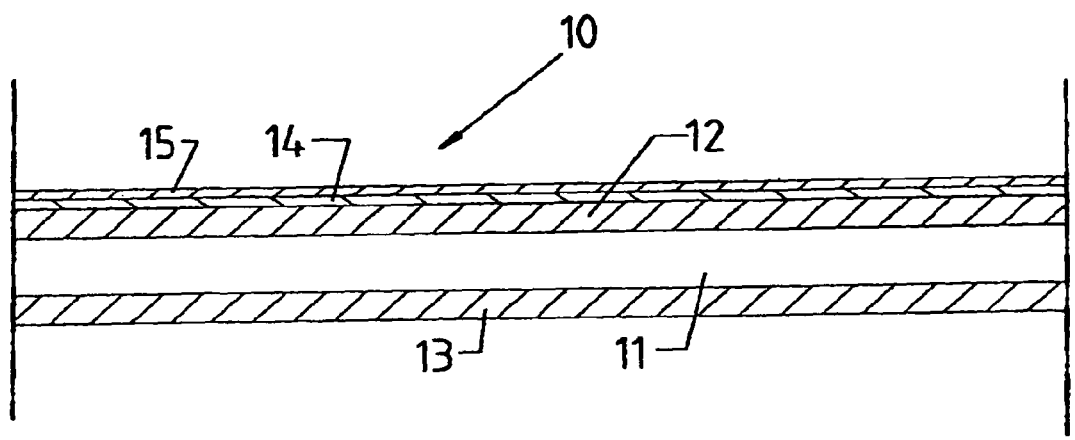
FIG. 3 shows a schematic representation of the layer construction of one embodiment of the metal-ceramic substrate according to the invention.

FIG. 3 shows the general layer construction of a metal-ceramic substrate 10 according to the invention. This substrate is made up of the ceramic layer 11, which is provided on each side with a metallic layer 12 and 13 of a first type. In the depicted embodiment, the metallic layers 12 and 13 are formed from metallic foils, which are applied in a plane manner to the surface of the ceramic layer 11 by means of the direct bonding process.

A layer 14 made of a dielectric or insulating material is applied to the upper metallic layer 12 in FIG. 3, the insulating layer having a thickness that is considerably less than the thickness of the metallic layers 12 and 13. The layer 14 is made for example of a glass-containing material, which is applied to the metallic layer 12 by means of heating or baking. A second metallic layer 15 of a second type is provided on the insulating layer 14. The metallic layer 15 is manufactured by applying a conductive paste and by baking this paste, likewise with a thickness that is considerably less than the thickness of the metallic layers 12 and 13.

The thickness of the ceramic layer 11 is, for example, 0.2 to 2 mm. The metallic layers 12 and 13 have a thickness, for example, between 0.1 and 0.9 mm. The insulating layer 14 has a thickness between 0.015 and 0.15 mm. The thickness of the metallic layer 15 is between approx. 0.015 and 0.15 mm.

In the depicted embodiment, the metallic layers 12 and 13 have the same thickness and are made of copper. The ceramic of the ceramic layer 11 is, for example, an aluminum oxide ceramic.

The multi-layer metal-ceramic substrate is manufactured for example in a process with the following process steps:

a) To form the metallic layers 12 and 13, at least two blanks of a copper foil oxidized on their surfaces are applied to one surface of the ceramic layer 11 by means of the DCB process. Before this application, the copper foil blanks are tempered, preferably in a preceding step, in a protective gas atmosphere, for example in a nitrogen atmosphere, for the purpose of reducing the hardness of the copper material.

b) After cooling, a layer made of a glass-containing paste forming the later insulating layer 14 is applied to the metallic layer 12 by means of pressing or some other suitable method.

c) The paste is dried and then baked on at a temperature below the temperature of the DCB process, i.e. at a temperature between 750 and 1030° C., so that the paste then forms the insulating layer 14 adhering to the metallic layer 12.

d) After cooling again, a conductive paste containing metallic constituents is applied to the insulating layer 15, likewise for example by pressing or some other suitable process.

e) The conductive paste (thick film) is then baked on at a temperature between 750 and 1030° C.

In order to achieve a greater thickness for the insulating layer 14 and/or the metallic layer 15, the process steps b) and c) and/or d) and e) can be repeated one or more times. Generally it is also possible to apply at least one further layer made up of at least the insulating layer 14 and one further metallic layer 15 to the metallic layer 15. The oxidation of the copper foil blanks can take place before and/or after tempering and also during the DCB process.

For the insulating layer 14, a paste is preferably used that after baking produces a layer 14 with a higher melting point than the paste before baking, so that repeated application and baking of the glass-containing paste is possible in order to achieve a thicker layer. The same applies to the paste used for the metallic layer 15. A suitable paste for manufacturing the insulating layer 14 is, for example, the paste "Dielectric Composition 4575D" available from Du Pont Electronics. A suitable paste for manufacturing the metallic layer 15 is, for example, the paste "Copper Conductor Composition 9922" also available from Du Pont Electronics.

Figure 4:
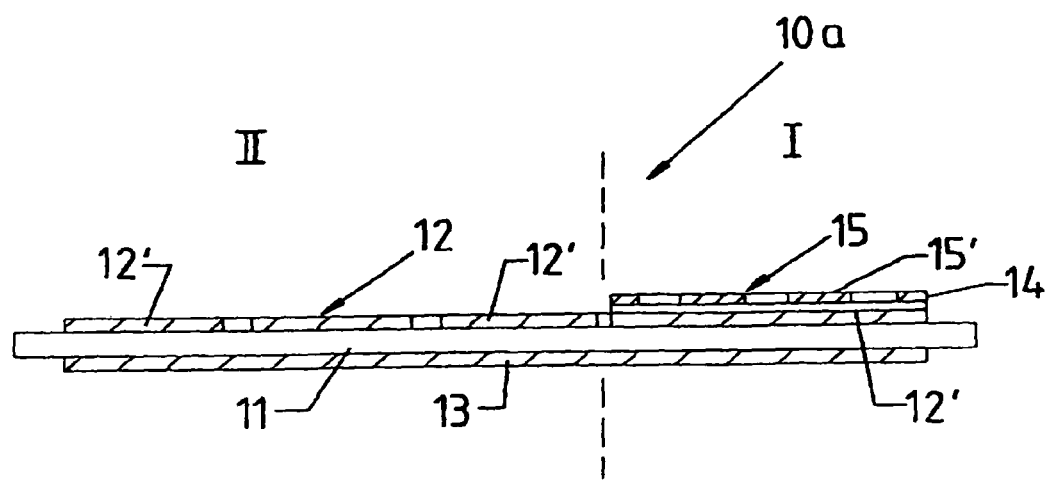
FIG. 4 shows a cross section of a metal-ceramic substrate of FIG. 3, structured with an area for holding at least one power semiconductor component and a further area for a control circuit.

For the explanation of the general layer construction and of possible manufacturing processes, it was assumed above that the composite layer consisting of the insulating layer 14 and the metallic layer 15 covers the metallic layer 12 over its entire surface. In practical applications of the substrate according to the invention, the application of the composite layer(s) 14/15 takes place in a manner that said composite layer(s) cover only a partial area of the surface of the metallic layer 12, as indicated in FIG. 4 in the section I of the metal-ceramic substrate 10a there, while in section II the surface of the metallic layer 12 is exposed. This makes it possible to structure the metallic layer 12 using a suitable technology, for example etch-masking technology, for the purpose of forming conductor strips, contact surfaces, etc. as indicated in FIG. 4 by 12'. In the same manner, the metallic layer 15 is also structured to form conductor strips, contact surfaces, etc. as indicated by 15'. The structuring of the metallic layer 15 is much finer than the structuring of the metallic layer 12, which is possible simply due to the considerably lower thickness of the metallic layer 15.

The structuring of the metallic layer 15 takes place for example likewise by means of etch-masking technology and/or already by the structured application of the conductive paste forming the metallic layer 15, for example by structured pressing.

If the metallic layer 15 is structured with an etch-masking process, which is to take place after the structuring of the metallic layer 12, it is generally not necessary to cover the structured metallic layer 12 or its areas 12' with an etch-resistant mask. Since the thickness of the metallic layer 15 is much lower than the thickness of the metallic layer 12, an additional reaction of the etching medium during structuring of the metallic layer 15 has no effect on the metallic layer 12. At most, this would cause the edges of the structured areas 12' to be rounded, with the positive effect of preventing sharp edges and increasing the electric strength.

The use of the direct bonding process for applying the metallic layers 12 and 13 achieves a high bonding strength (peel strength) greater than 30 N/cm for these metallic layers on the ceramic layer 11. This high bonding strength is essential in order to prevent peeling or detachment of the metallic layer 12, particularly on the edge of the metallic layer 12 or the structured areas 12', such peeling or detachment resulting from thermal tensions after cooling of the insulating layer 14 and/or of the metallic layer 15, after they are baked on respectively.

Figure 5:
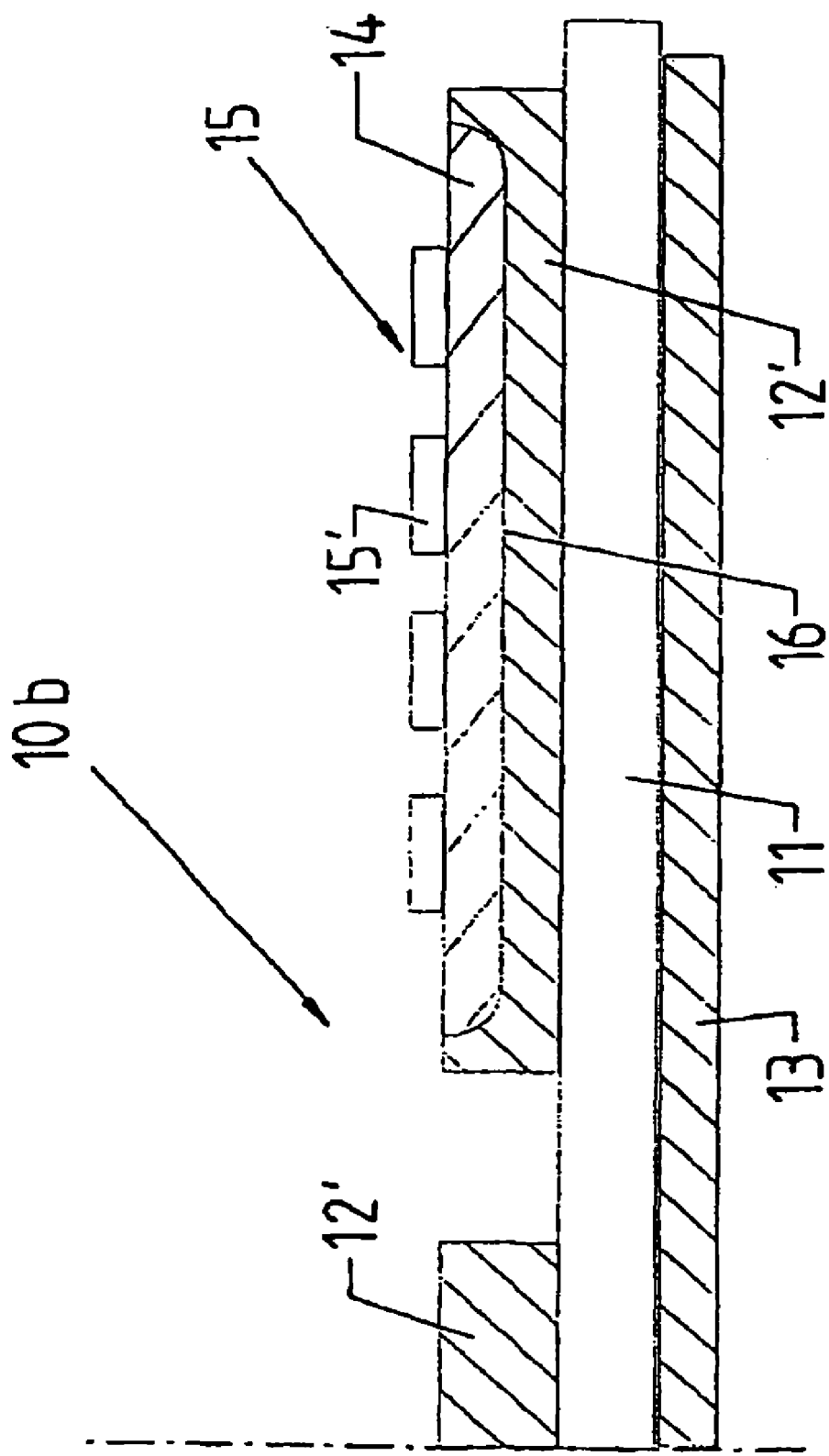
FIGS. 5 and 6 show a schematic representation of the layer construction of further embodiments of the metal-ceramic substrate according to the invention.

FIG. 5 shows as a further possible embodiment a metal-ceramic substrate 10b, which differs from the substrate 10a essentially only in that the insulating layer 14 is located in a trough-like recess 16 of a structured area 12' of the metallic layer 12. In deviation from the method described above for manufacturing the metal-ceramic substrate 10, the substrate 10b is manufactured for example so that after application of the metallic layers 12 and 13 by means of direct bonding (process step a)), in one or more subsequent process steps, for example by means of an etch-masking process, first the trough-shaped recess 16 is formed in the metallic layer 12, without further structuring of the metallic layer 12. Only then is the insulating layer 14 formed in the recess 16 in the further process steps b) and c), which again can be repeated one or more times, and then the metallic layer 15 is applied in process steps d) and e), which also can be repeated. In further process steps, the metallic layers 12 and 15 are structured, for example likewise with etch-masking technology, in order to form the structured areas 12' and 15'. One structured area 12' then comprises the recess 16 with the insulating layer 14. The remaining structured areas 12' form for example contact surfaces, conductor strips, etc. for the semiconductor power component(s).

The metallic layer 15 in the depicted embodiment is structured so that all areas 15' are electrically insulated by means of the insulating area 14 from the area 12' comprising the recess 16. At least some of the areas 15' form conductor strips, contact surfaces, etc. for the low power control circuit.

Of course, other processes are also conceivable for manufacturing the metal-ceramic substrate 10b, e.g. such processes in which during creation of the recess 16 or in a preceding or subsequent process step, the structuring of the metallic layer for forming the areas 12' and/or the structured areas 15' of the metallic layer takes place by means of structured application of the paste forming the metallic layer.

The metal-ceramic substrate 10b with the recess 16 features the advantage that the application of the insulating layer 14 is simplified and also that the top of this insulating layer is located in one plane with the top of the metallic layer 12 or the areas 12', which is especially advantageous for the manufacturing process, particularly for the further processing of this substrate.

This embodiment also makes it possible to apply the insulating layer 14 so that the top of the area 12' comprising the recess 16 is reliably kept free of the material forming the insulating layer 14, resulting in a purely metallic surface outside of the insulating layer 14 on the top of the area 12' comprising the recess 16, on which (metallic surface) additional elements, such as a housing, can be hermetically fastened e.g. by means of soldering or some other means, without hindrance from remainders of the material forming the insulating layer 14.

Figure 6:
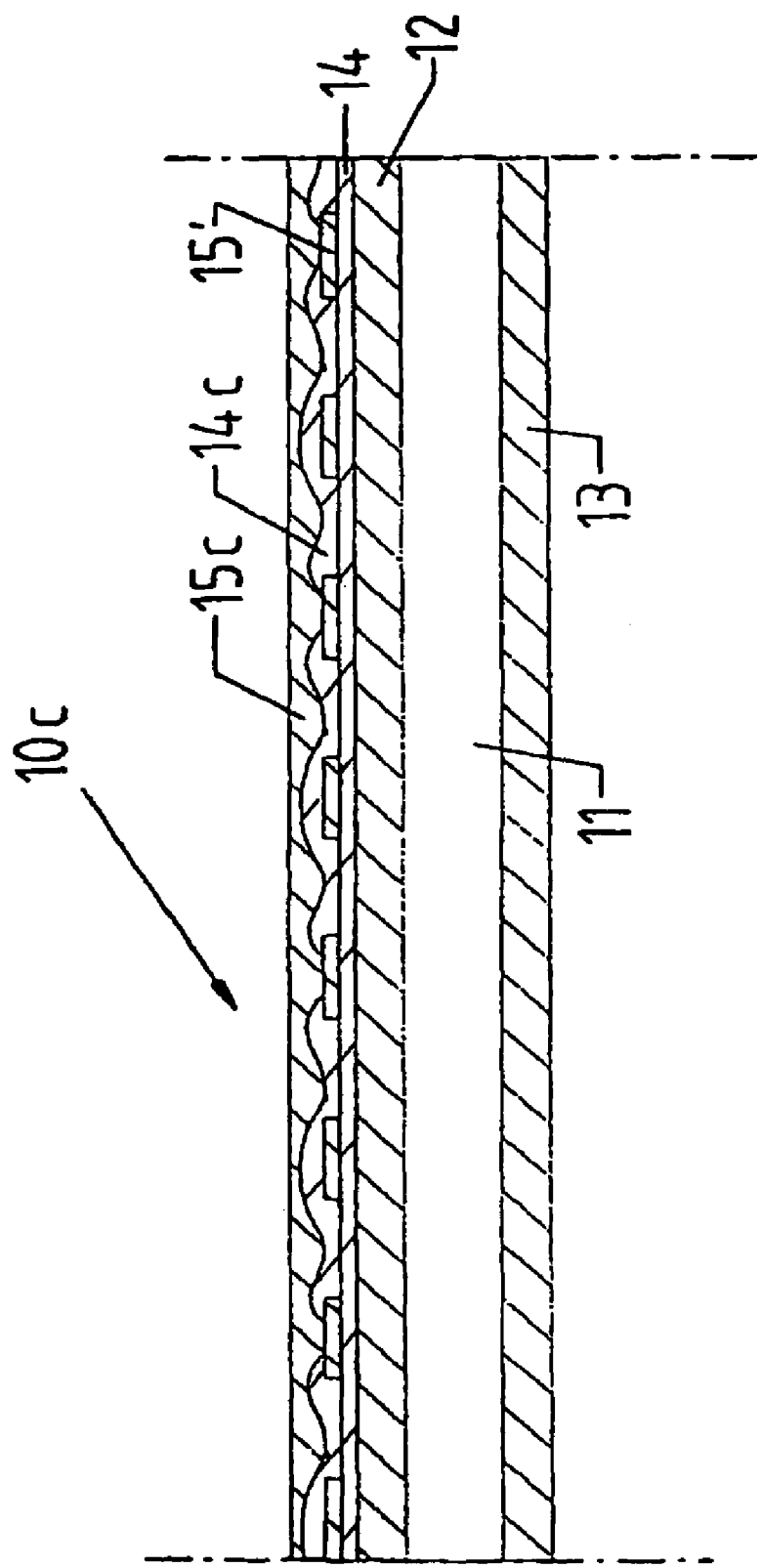

FIG. 6 shows as a further possible embodiment a partial section of the layer construction of a metal-ceramic substrate 10c, which differs from the substrate 10 in that after structuring of the metallic layer 15, a further insulating layer 14 is applied to this metallic layer or to its structured areas 15', likewise by application of the glass-containing paste and baking of the paste after drying.

During application of the additional insulating layer 14c, openings or windows are provided in this layer, above several of the structured areas 15', so that during application of the additional metallic layer 15c, which corresponds to the metallic layer 15 and which likewise is produced by application and baking of the conductive paste, an electrical connection between the structured areas 15' and the additional metallic layer 15c above these areas exists. Of course, it is also possible to apply additional composite layers, consisting of at least one insulating layer corresponding to the insulating layer 14 or 14c and at least one metallic layer corresponding to the metallic layer 15 or 15c, on the metallic layer 15c, preferably after structuring of this metallic layer. The construction depicted in FIG. 6 can therefore be used to achieve very complex metal-ceramic substrates or substrate areas for circuits with reduced power, particularly for control circuits for electric power components, with a small overall size.

Figure 7:
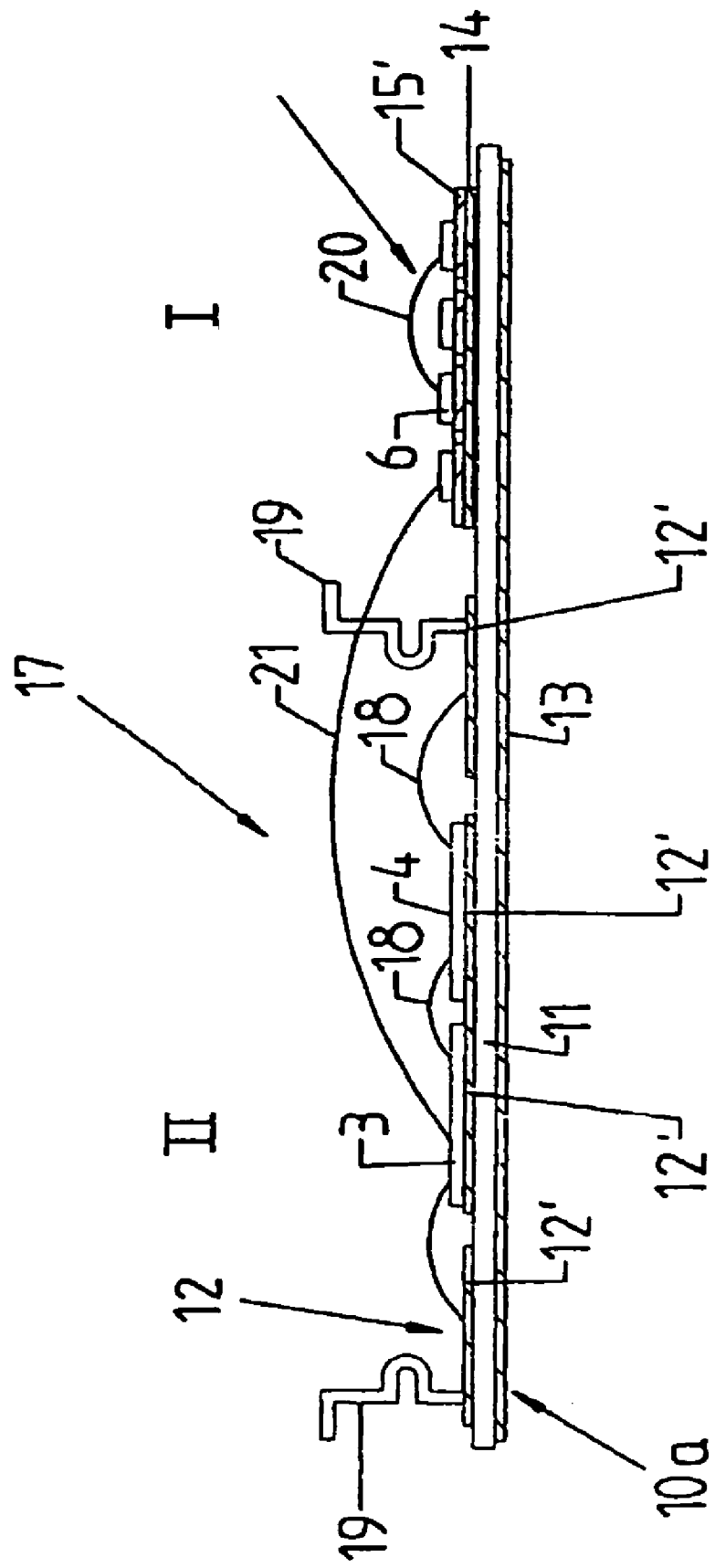
FIG. 7 shows a cross section of a semiconductor module manufactured using the structured metal-ceramic substrate of FIG. 4.

FIG. 7 shows a simplified representation in cross section of a semiconductor module 17, which is manufactured using the metal-ceramic substrate 10a. One semiconductor component 3 or 4 is provided respectively on section II of the substrate 10a and on two structured areas 12' located there. By means of electrical connections 18 (e.g. wire bonds) the components 3 and 4 are connected with additional areas 12', which serve as contact surfaces and on which external power connections 19 are provided.

The structured areas 15' form the conductor strips, contact surfaces, etc. for the control circuit or driver for controlling the power stage comprising the components 3 and 4. The corresponding components 6 of this driver stage are provided on the areas 15'. Additional areas 15' form contact surfaces, which are connected by means of internal connections 20 with the components, conductor strips, etc. and which then for example also form external control connections for the module 17, in addition to contact surfaces, which are connected by means of internal connections 21 with the power element II.

Figure 8:
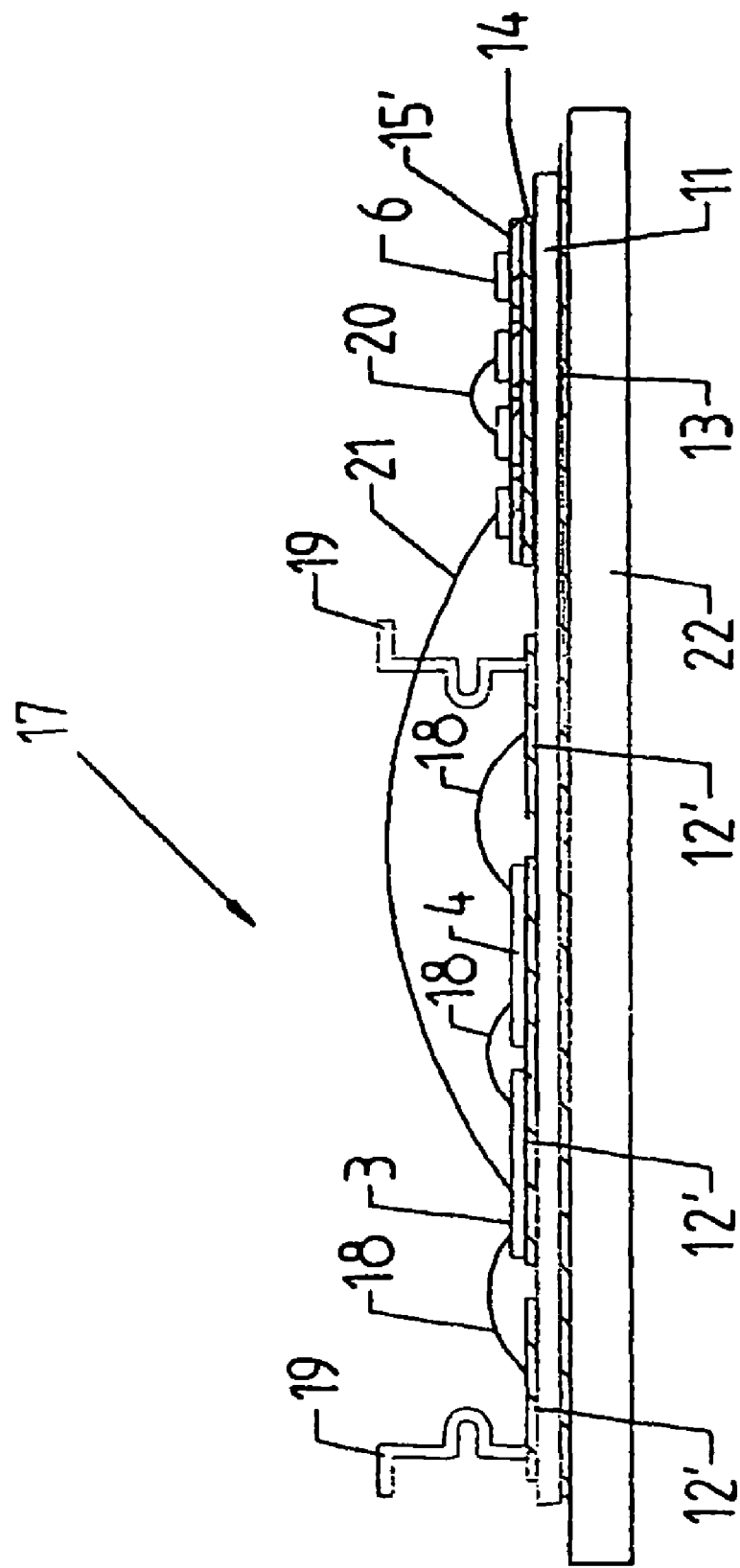
FIG. 8 shows the semiconductor module of FIG. 7, however together with an additional base plate.

FIG. 8 again shows the power module 17, together with a base plate 22 made of a material having high heat conductivity and high mechanical stability. Especially with large, complex modules, this base plate 22 is useful for increasing the mechanical and/or thermal stability and also for preventing deformation of the metal-ceramic substrate 10a in case of fluctuations in temperature, etc.

Figure 9:
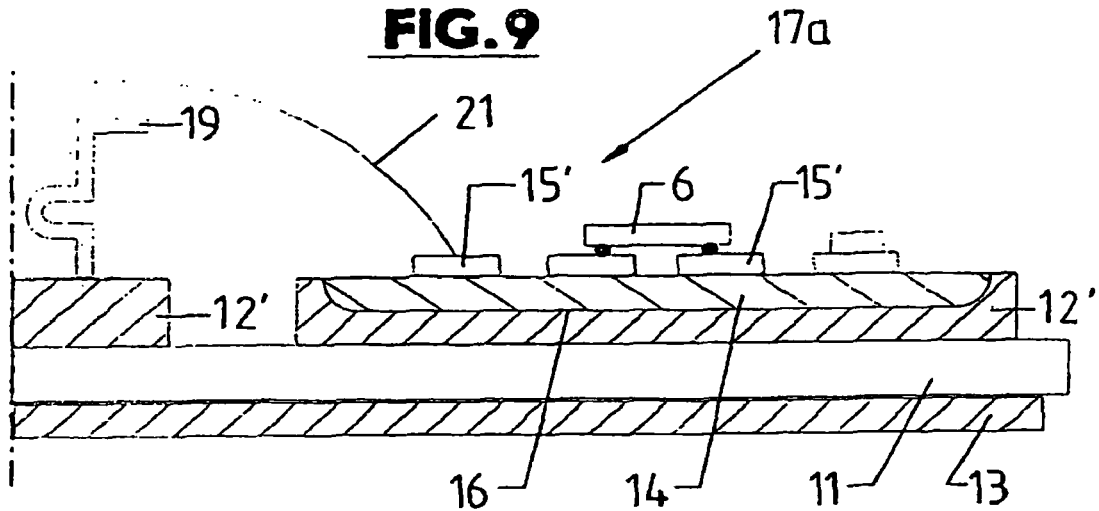
FIG. 9 shows a partial representation of a semiconductor module manufactured using the structured metal-ceramic substrate of FIG. 5.

Instead of the substrate 10a, another metal-ceramic substrate according to the invention can be used for the power module, for example the substrate 10b or 10c, i.e. a substrate with the construction depicted in FIGS. 5 and 6. FIG. 9 shows a module 17a with the substrate 10b.

Copper is a suitable metal for the metallic layers, particularly also for the metallic layers 12 and 13, whereby the metallic layers 12 and 13 are then manufactured using copper foils and using the direct copper bonding technology. The use of other metals is also generally possible.

A suitable ceramic for the ceramic layer 11 is, for example, an aluminum oxide ceramic ($Al_2O_3$). Other ceramics are also conceivable, for example AlN, BeO, CBN, $Si_3N_4$ and SiC.

In the method described above in connection with FIG. 3 it was assumed that the metal or conductive paste (thick film paste) forming the metallic layer is either applied in an unstructured state and then baked on, after which structuring takes place by means of a suitable method, e.g. an etch-masking method, for producing the areas 15', or the conductive paste is already applied with the desired structuring and baked on. It is also possible to use a photo-sensitive conductive paste, i.e. a conductive paste, which after being applied and before being baked on is exposed corresponding to the desired structure, whereby then for example the non-exposed areas are removed in a subsequent process step ("developing process"), in order to achieve a very fine structuring before the conductive paste is baked on. The photo-sensitive conductive paste can also be designed so that after exposure, the exposed areas can be removed.

A method for producing the metal-ceramic substrate would then comprise the following process steps when using the photo-sensitive conductive paste:

a) To form the metallic layers 12 and 13, at least two blanks of a copper foil oxidized on their surfaces are applied to one surface of the ceramic layer 11 by means of the DCB process. Before this application, the copper foil blanks are tempered, preferably in a preceding step, in a protective gas atmosphere, for example in a nitrogen atmosphere, for the purpose of reducing the hardness of the copper material.

b) After cooling, a layer made of a glass-containing paste forming the later insulating layer 14 is applied to the metallic layer 12 by means of pressing or some other suitable method.

c) The paste is dried and then baked on at a temperature below the temperature of the DCB process, i.e. at a temperature between 750 and 1030° C., so that the paste then forms the insulating layer 14 adhering to the metallic layer 12.

d1) Afterwards, a layer consisting of the photo-sensitive conductive paste is applied and this layer is exposed corresponding to the desired structure.

d2) In a subsequent process step, the exposed or non-exposed areas are removed from the layer formed by the paste.

e) The structured conductive paste (thick film) is then baked on at a temperature between 750 and 1030° C.

The structuring of the metallic layer 12 takes place in this process for example before the application of the insulating layer 14, i.e. following the above process step a).

Figure 10:
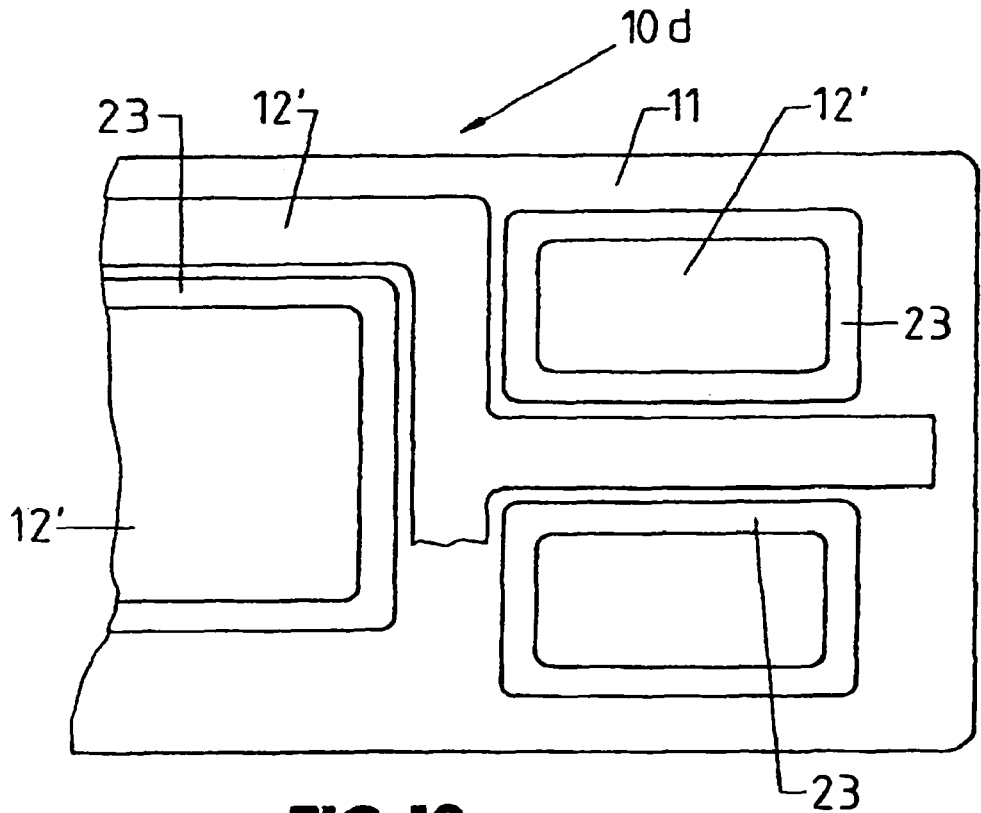
FIG. 10 shows a simplified representation in top view of a further possible embodiment of the metal-ceramic substrate according to the invention.

FIG. 10 shows a simplified partial representation in top view of a metal-ceramic substrate 10d with the structured areas 12' formed by the metallic layer 12. Several areas 12' in the depicted embodiment are provided on their edge with a frame-like solder stop application 23, which is formed from a layer consisting of the conductive paste, e.g. "Dielectric Composition 4575D" applied to the exposed top of the areas 12', as used above for the insulating layer 14. This layer 23 has been proven to provide an optimum solder stop, i.e. it effectively prevents solder from flowing over this solder stop to adjacent areas 12' during soldering of components, connections, etc. to areas provided with the solder stop, thus preventing unwanted electrical connections. Each solder stop application 23 encloses the part of the structured area 12' on which (part) solder is later applied. Due to the material used (glass-containing paste), the respective solder stop application 23 has a high degree of heat resistance, which in turn allows the use of solders with high processing temperatures, particularly also lead-free solders.

The substrate 10d is manufactured in the manner that after application of the metallic layer 12 and also of the metallic layer 13, if applicable, to the ceramic layer 11 by means of the direct bonding process and after structuring of the metallic layer 12, the glass-containing paste is applied corresponding to the desired flow of the respective solder stop application 23 to areas 12', namely with a thickness of approximately 0.015-0.15 mm. After the paste dries, it is baked on at a temperature between 750 and 1030° C.

If at least one insulating layer 14 is applied to the substrate 10d, then the application, drying and baking of the glass-containing paste for the insulating layer 14 and the respective solder stop application 23 takes place in common steps.

The invention was described above based on exemplary embodiments. It goes without saying that numerous modifications and variations are possible without abandoning the underlying inventive idea upon which the invention is based.

REFERENCE NUMBERS 1, 1a semiconductor power module according to the state of the art
2 metal-ceramic substrate
3, 4 semiconductor power components
5 additional printed circuit board
6 components of a control or driver stage
7 base plate
10, 10a, 10b metal-ceramic substrate according to the invention
10c, 10d metal-ceramic substrate according to the invention
11 ceramic layer
12, 13 metallic layer
12' structured area
14, 14c insulating layer
15, 15c additional metallic layer
15' structured area
16 recess
17, 17a power module according to the invention
18 internal connection
19 external power connection
20, 21 internal connection
22 base plate
23 solder stop application

What is claimed is:

1. A semiconductor module comprising
a metal-ceramic substrate,
at least one first power circuit part having at least one power component, at least one second low-power circuit part of the module having at least one low power component,
said substrate comprising at least one ceramic layer having a thickness between 0.2-2 mm and at least one metallic layer of a first type applied to the surface of the ceramic layer and with a thickness between 0.1 and 0.9 mm,
said substrate further comprising an insulating layer made of a glass-containing paste material with a thickness of approximately 0.015-0.15 mm and being applied only to a surface of at least one partial area of the at least one metallic layer of the first type which surface facing away from the ceramic layer,
at least one structured metallic layer of a second type having a thickness between 0.015-0.15 mm is applied to this insulating layer wherein the insulating layer is adhered to the at least one metallic layer of the first type by a process comprising drying the paste and then baking the paste at a temperature between 750° C. and 1030° C. so that the paste forms the insulating layer and then cooling the paste so that it adheres to the at least one metallic layer of the first type thereby achieving the desired thickness,
the at least one metallic layer of the first type is structured such that it forms strip conductors, contact surfaces or mounting surfaces for the at least one power component as well as said at least one partial area of the at least one metallic layer of the first type,
wherein the at least one metallic layer of the second type forms strip conductors, contact surfaces or mounting surfaces for the at least one low power component, and
wherein the insulating layer is provided in a depression or recess of the at least one partial area of the at least one metallization of the first type.

2. The module according to claim 1, wherein the at least one metallic layer of the second type forms at least one control or driving area of the substrate.

3. The module according to claim 1, wherein several composite layers consisting of insulating layers and metallic layers of the second type are provided on the at least one partial area of the at least one metallization of the first type.

4. The module according to claim 1, wherein the recess has a depth between approximately 0.015 and 0.15 mm.

5. The module according to claim 1, wherein the at least one metallic layer of the first type is applied to the ceramic layer with a peel strength greater than 30 N/cm.

6. The module according to claim 1, wherein the thermal expansion coefficient of the at least one metallic layer of the first type in the plane of the substrate, i.e. parallel to a top of the substrate, is less than 10 ppm.

7. The module according to claim 1, wherein the metal of the at least one metallic layer of the first type is copper.

8. The module according to claim 1, wherein the at least one metallic layer of the first type is formed from a metal foil, which is attached by means of the direct bonding process to the ceramic layer.

9. The module according to claim 1, wherein the at least one metallic layer of the second type is produced using a conductive paste.

10. The module according to claim 1, wherein at least one structured area of the at least one metallic layer of the first type is provided with a solder stop application consisting of a glass-containing material.

11. The module according to claim 10, wherein the solder stop application is produced by application and baking of a glass-containing paste.

12. The module according to claim 10, wherein the solder stop application has a thickness of approximately 0.015 to 0.15 mm.

13. The module according to claim 1, wherein a metallic layer of the first type is applied to each surface of the at least one ceramic layer.

14. The module according to claim 13, wherein the at least one insulating layer with the metallic layer of the second type and/or a composite layer formed by several insulating layers and several metallic layers of the second type are provided only on one of the two metallic layers of the first type.

15. A metal-ceramic substrate for electric circuits or modules comprising
at least one power circuit part,
at least one low-power circuit part,
at least one ceramic layer having a thickness between 0.2-2 mm,
at least one metallic layer of a first type applied to the surface of the ceramic layer having a thickness between 0.1 and 0.9 mm,
an insulating layer made of a glass-containing paste having a thickness of approximately 0.015-0.15 mm applied only to a surface of at least one partial area of the at least one metallic layer of the first type which surface facing away from the ceramic layer,
at least one structured metallic layer of a second type having a thickness between 0.015-0.15 mm applied to the insulating layer wherein the insulating layer is adhered to the at least one metallic layer of the first type by a process comprising drying the paste and then baking the paste at a temperature between 750° C. and 1030° C. so that the paste forms the insulating layer and then cooling the paste so that it adheres to the at least one metallic layer of the first type thereby achieving the desired thickness,
the at least one metallic layer of the first type forming strip conductors, contact surfaces or mounting surfaces for at least one component of at least one power circuit part as well as said at least one partial area of the at least one metallic layer of the first type, and
the at least one metallic layer of the second type forms strip conductors, contact surfaces or mounting surfaces for at least one component of a low power circuit part, wherein the insulating layer is provided in a depression or recess of the at least one partial area of the at least one metallization of the first type.

16. The substrate according to claim 15, wherein the at least one metallic layer of the second type forms at least one control or driving area of the substrate.

17. The substrate according to claim 15, wherein several composite layers consisting of insulating layers and metallic layers of the second type are provided on the at least one partial area of the at least one metallization of the first type.

18. The substrate according to claim 15, wherein the recess has a depth between approximately 0.015 and 0.15 mm.

19. The substrate according to claim 15, wherein the at least one metallic layer of the first type is applied to the ceramic layer with a peel strength greater than 30 N/cm.

20. The substrate according to claim 15, wherein the thermal expansion coefficient of the at least one metallic layer of the first type in the plane of the substrate, i.e. parallel to a top of the substrate, is less than 10 ppm.

21. The substrate according to claim 15, wherein the metal of the at least one metallic layer of the first type is copper.

22. The substrate according to claim 15, wherein the at least one metallic layer of the first type is formed from a metal foil or copper foil, which is attached by means of the direct bonding process to the ceramic layer.

23. The substrate according to claim 15, wherein the at least one metallic layer of the second type is produced using a conductive paste.

24. The substrate according to claim 15, wherein the at least one partial area of the metallic layer of the first type is provided with a depression or recess on its surface facing away from the ceramic layer, and wherein the insulating layer with the metallic layer of the second type is provided in said depression and recess.

25. The substrate according to claim 15, wherein at least one structured area of the at least one metallic layer of the first type is provided with a solder stop application consisting of a glass-containing material.

26. The substrate according to claim 25, wherein the solder stop application is produced by application and baking of a glass-containing paste.

27. The substrate according to claim 25, wherein the solder stop application has a thickness of approximately 0.015 to 0.15 mm.

28. The substrate according to claim 15, wherein a metallic layer of the first type is applied to each surface of the at least one ceramic layer.

29. The substrate according to claim 28, wherein the at least one insulating layer with the metallic layer of the second type and/or a composite layer formed by several insulating layers and several metallic layers of the second type are provided only on one of the two metallic layers of the first type.

30. A semiconductor module comprising
a metal-ceramic substrate,
at least one first power circuit part having at least one power component, at least one second low-power circuit part of the module having at least one low power component,
said substrate comprising at least one ceramic layer having a thickness between 0.2-2 mm and at least one metallic layer of a first type applied to the surface of the ceramic layer and with a thickness between 0.1 and 0.9 mm,
said substrate further comprising an insulating layer made of a glass-containing paste material with a thickness of approximately 0.015-0.15 mm and being applied only to a surface of at least one partial area of the at least one metallic layer of the first type which surface facing away from the ceramic layer, at least one structured metallic layer of a second type having a thickness between 0.015-0.15 mm is applied to this insulating layer wherein the insulating layer is adhered to the at least one metallic layer of the first type by a process comprising drying the paste and then baking the paste at a temperature between 750° C. and 1030° C. so that the paste forms the insulating layer and then cooling the paste so that it adheres to the at least one metallic layer of the first type thereby achieving the desired thickness, the at least one metallic layer of the first type is structured such that it forms strip conductors, contact surfaces or mounting surfaces for the at least one power component as well as said at least one partial area of the at least one metallic layer of the first type, wherein the at least one metallic layer of the second type forms strip conductors, contact surfaces or mounting surfaces for the at least one low power component, and wherein the at least one partial area of the metallic layer of the first type is provided with a depression or recess on its surface facing away from the ceramic layer, and wherein the insulating layer with the metallic layer of the second type is provided in said depression and recess.

31. A semiconductor module comprising a metal-ceramic substrate, at least one first power circuit part having at least one power component, at least one second low-power circuit part of the module having at least one low power component, said metal-ceramic substrate comprising at least one ceramic layer having a thickness between 0.2-2 mm and metal layers of a first type applied to opposed surface sides of the ceramic layer and having a thickness between 0.1 and 0.9 mm, at least the metallic layer of the first type on one of the opposing surface sides of the ceramic layer is structured such that it forms strip conductors, contract surfaces or mounting surfaces for the at least one power component as well as at least one partial area of the metallic layer of the first type, said metal-ceramic substrate further comprising an insulating layer made of a glass-containing paste with a thickness of approximately 0.015-0.15 mm and being applied only to a surface of the at least one partial area of the metallic layer of the first type which surface facing away from the ceramic layer, at least one structured metallic layer of a second type technique having a thickness between 0.015-0.15 mm is applied to the insulating layer wherein the insulating layer is adhered to the at least one metallic layer of the first type by a process comprising drying the paste and then baking the paste at a temperature between 750° C. and 1030° C. so that the paste forms the insulating layer and then cooling the paste so that it adheres to the at least one metallic layer of the first type thereby achieving the desired thickness, wherein the at least one metallic layer of the second type forms strip conductors, contact surfaces or mounting surfaces for at least one low power component, and wherein the at least one partial area of the metallic layer of the first type is provided with a depression or recess on its surface facing away from the ceramic layer, and wherein the insulating layer with the metallic layer of the second type is provided in said depression and recess.

32. A metal-ceramic substrate for electric circuits and modules comprising one first power circuit part, at least one low-power circuit part, said metal-ceramic substrate comprising at least one ceramic layer having a thickness between 0.2-2 mm and metal layers of a first type applied to opposed surface sides of the ceramic layer and having a thickness between 0.1 and 0.9 mm, at least the metallic layer of the first type on one of the opposing surface sides of the ceramic layer is structured such that it forms strip conductors, contract surfaces or mounting surfaces for the at least one power component as well as at least one partial area of the metallic layer of the first type, said metal-ceramic substrate further comprising an insulating layer made of a glass-containing paste with a thickness of approximately 0.015-0.15 mm and being applied only to a surface of the at least one partial area of the metallic layer of the first type which surface facing away from the ceramic layer, at least one structured metallic layer of a second type having a thickness between 0.015-0.15 mm is applied to the insulating layer wherein the insulating layer is adhered to the at least one metallic layer of the first type by a process comprising drying the paste and then baking the paste at a temperature between 750° C. and 1030° C. so that the paste forms the insulating layer and then cooling the paste so that it adheres to the at least one metallic layer of the first type thereby achieving the desired thickness, wherein the at least one metallic layer of the second type forms strip conductors, contact surfaces or mounting surfaces for at least one low power component, and wherein the at least one partial area of the metallic layer of the first type is provided with a depression or recess on its surface facing away from the ceramic layer, and wherein the insulating layer with the metallic layer of the second type is provided in said depression and recess.

* * * * *